(12) United States Patent
Kamitani et al.

(10) Patent No.: US 7,270,058 B2
(45) Date of Patent: Sep. 18, 2007

(54) PHOTOSENSITIVE PLANOGRAPHIC PRINTING PLATE AND METHOD OF PRODUCING THE SAME

(75) Inventors: Kiyoshi Kamitani, Shizuoka-ken (JP); Yuzoh Inukai, Shizuoka-ken (JP); Akio Oda, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 52 days.

(21) Appl. No.: 10/941,841

(22) Filed: Sep. 16, 2004

(65) Prior Publication Data

US 2005/0061178 A1 Mar. 24, 2005

(30) Foreign Application Priority Data

Sep. 17, 2003 (JP) ............... 2003-324462

(51) Int. Cl.
*B41C 3/08* (2006.01)
*B41N 6/00* (2006.01)

(52) U.S. Cl. ............... 101/401.1; 205/69; 205/127

(58) Field of Classification Search ............ 101/401.1; 205/69, 127
See application file for complete search history.

(56) References Cited

U.S. PATENT DOCUMENTS 3,508,924 A 4/1970 Pickard
3,511,661 A * 5/1970 Deerhake et al. ........ 430/278.1
6,014,929 A 1/2000 Teng
6,242,156 B1 6/2001 Teng

FOREIGN PATENT DOCUMENTS

| CH | 668 654 A5 | 1/1989 |
|---|---|---|
| EP | 0 766 140 A1 | 4/1997 |
| EP | 1 106 382 A1 | 6/2001 |
| EP | 1 157 854 A2 | 11/2001 |
| EP | 1 172 697 A2 | 1/2002 |
| EP | 1 287 986 A1 | 3/2003 |
| JP | 6-135174 A | 5/1994 |
| JP | 07-089255 * | 4/1995 |
| WO | 96/00492 A1 | 1/1996 |
| WO | WO 03/008672 A1 | 1/2003 |
| WO | WO 03/073164 A2 | 9/2003 |

* cited by examiner

*Primary Examiner*—Daniel J. Colilla
*Assistant Examiner*—Marissa Ferguson-Samreth
(74) *Attorney, Agent, or Firm*—Sughrue Mion, PLLC

(57) ABSTRACT

In a method of producing a photosensitive planographic printing plate according to the present invention, a web is coated with a coating solution, and a coating solution film thus formed is rapidly dried. For this drying, fresh air is blown onto the web W heated with a heat roll such that the air is blown parallel to the coating solution film. The coating solution film can thereby be prevented from changing its thickness due to an air stream during drying, while the coating solution film can be rapidly dried. Accordingly, the coating solution film can be dried before the film is leveled, to form a coating layer having uniform thickness.

6 Claims, 4 Drawing Sheets

PHOTOSENSITIVE PLANOGRAPHIC PRINTING PLATE AND METHOD OF PRODUCING THE SAME

CROSS-REFERENCE TO RELATED APPLICATION

This application claims priority under 35 USC 119 from Japanese Patent Application No. 2003-324462, the disclosure of which is incorporated by reference herein.

BACKGROUND OF THE INVENTION

1. Field of the Invention

The present invention relates to a photosensitive planographic printing plate and a method of producing the same, and in particular to a photosensitive planographic printing plate most suitable as a multi-layer printing plate having a plurality of coating layers formed therein and a method of producing the same.

2. Description of the Related Art

In a production line for a photosensitive planographic printing plate, a web (aluminum continuous support) is fed in a longitudinal direction while one uneven side of the web is coated with a photosensitive coating solution, and this solution is dried to form a coating layer (photosensitive layer as dry film). Various attempts have been made to conduct this drying efficiently.

For example, Japanese Patent Application Laid-Open (JP-A) No. 7-89255 prescribes the ratio of the thickness of a photosensitive layer to the height of protrusions on a grained surface of a web, and after application of a coating solution onto the web, pressurized air is blown from a slit nozzle to the resulting wet coating, to permit the surface of the photosensitive layer to have a contour shape along the uneven surface of the web. Whether the photosensitive layer is a single or multiple layer is not particularly prescribed in JP-A No. 7-89255. In JP-A No. 6-317896, a planographic printing plate is heated such that the temperature of the printing surface is kept in a range of 50 to 130° C. by irradiation with far infrared rays in a drying process, thereby reducing the time required for the drying process to improve production efficiency.

In JP-A No. 6-63487, hot air is blown over a web, and then a heat roll is brought into contact with the web so as to make the contact area changeable, thereby controlling the dry state. In JP-A No. 8-318198, a heat roll is used in the latter half of a process of drying with hot air blown over a web. In this case, the temperature of the web is monitored, the lap width of the heat roll is regulated, and heating with the heat roll and blowing of hot air are simultaneously conducted.

As a photosensitive planographic printing plate in recent years, a direct printing plate is mainly used, and the use of a multi-layer printing plate is increasing in order to differentiate functions which are required of a photosensitive planographic printing plate. For continuous mass production of the multi-layer printing plate, a coating drying zone needs to be added to a conventional coating drying line. However, when such a coating drying zone is added, there arises a problem in that compact arrangement of facilities, reduction in running cost by effectively utilizing the quantity of heat supplied, and consistent quality of a web of continuously changing size, etc. are to be especially persued. This problem has been a task in general photosensitive planographic printing plates, as well.

When the thickness of a coating layer (coating) is uneven in a multi-layer-type CTP plate, particularly in a thin layer of 1.0 g/m² or less, the sensitivity of the printing plate becomes uneven. Particularly, when there is a difference in film thickness between convex and concave portions of the grained surface of each layer, a noticeable difference in sensitivity occurs, which greatly influences the performance of the printing plate.

For example, when two layers of underlayer 84 and top layer 88 are formed on aluminum substrate 86 as shown in FIG. 5, the thickness $d_1$ of the top layer 88 in top layer portion 88S over convex portion 92 of the aluminum substrate 86 is about 0.14 μm, while the thickness $d_2$ of the top layer 88 in top layer portion 88T over concave portion 90 is about 1.0 μm. Accordingly, the excessively thin top layer portion 88S is poor in scratch resistance, while the excessively thick top layer portion 88T results in a dotted residual coating film because of failure to remove the coating by development treatment, thus hindering improvement in product yield. In the multi-layer-type CTP plate, therefore, there is also a problem in that, in order to improve the quality thereof, the top layer 88 must be provided with uniform thickness so that the functions of the top layer 88, which have been differentiated, are each successfully utilized.

This has serious implications for the multi-layer-type CTP plate mainly used in recent years. That is, an immediate solution is required for the above-described problem of the top layer in the multi-layer coating layer.

In a system of drying with air blown from an air slit nozzle as described in JP-A No. 7-89255, the speed of blown air is high. Accordingly, when this system is used in the first half of a drying process wherein a photosensitive solution film is thick, the state of the coating surface deteriorates. On the other hand, if the speed of blown air is decreased for securing the state of the coating surface, the effect of rapid drying is reduced. Thus, this system is unsuitable for drying the photosensitive solution film.

When the air slit nozzle is used in a production line wherein the size of a web (size of an aluminum substrate) is continuously changed, the quality thereof is significantly influenced by a slight difference in drying site. Further, a difference in drying speed occurs in the width direction. In short, application of the drying system using an air slit nozzle to a method of producing a planographic printing plate wherein drying starts from the edge of a web has not been put to practical use due to the difficulty in controllability.

It is difficult to solve the above problem even by drying methods described in other patent references.

SUMMARY OF THE INVENTION

In consideration of the above circumstances, an object of the present invention is to provide a high-quality photosensitive planographic printing plate and a method of producing the same, wherein a coating solution film can be efficiently dried to achieve compact facilities and improved productivity, and the issue of controllability of the continuous mass production line in the prior art can be improved to achieve consistent quality and uniform thickness of a coating layer.

A first aspect of the invention is to provide a photosensitive planographic printing plate produced by continuously running a web having a roughened surface and simultaneously forming a coating layer on the surface, wherein the coating layer contains a thinnest layer portion and a thickest layer portion, and the thinnest layer portion has a thickness of 50% or more of the average thickness of the coating layer, and the thickest layer portion has a thickness of 150% or less of the average thickness of the coating layer.

Since the microscopic thickness distribution of the coating layer can thereby be reduced, a microscopic difference in quality (mainly difference in sensitivity) in the printing plate can be reduced to achieve consistent quality, and a problem of insufficient scratch resistance and dotted residual film occurring in the prior art can be solved. The web is generally made of aluminum. In the present specification, the coating solution film refers to a coating whose drying has not been finished, and the coating layer refers to a coating whose drying has been finished.

In a multi-layer photosensitive planographic printing plate which is layered by successive coating, an aluminum substrate (aluminum support) subjected to graining treatment (brush grain, electrolytic grain) and anodizing treatment has unevenness at a surface thereof in a range of 1 to 5 μm in a wave height at a wavelength of 1 to 30 μm.

Recently, a printing plate generally has a very thin undercoat layer of 0.1 g/m² or less formed on an aluminum substrate, which undercoat layer cannot be detected as a coating thickness. When a photosensitive solution is applied onto this undercoat layer to form a photosensitive layer as a sublayer having a thickness in a range of 0.2 to 1.0 g/m², grained unevenness becomes significant relative to the thickness of the coating, and thus the coating is extremely thin in a grained convex portion, while the coating is extremely thick in a grained concave portion. As a result, a microscopic difference in performance occurs, which is attributable to the coating thickness distribution in the printing plate, and at the same time unevenness with reduced undulation resembling a pattern of grained unevenness remains on the surface of the sublayer.

When an intermediate layer or top layer with a thickness in a range of 0.2 to 1.0 g/m² having functions such as photosensitivity, thermal sensitivity, oxygen barrier properties and oxygen permeation controllability is formed on the sublayer, the layer formed in a convex portion of the surface of the sublayer is thin while the layer formed in a concave portion of the surface of the sublayer is thick, as is the case with the sublayer formed on the support. As a result, a microscopic difference in performance attributable to the coating thickness distribution in the top layer also occurs in the printing plate.

When one layer in the multi-layer photosensitive planographic printing plate satisfies the first aspect, the microscopic variation in thickness distribution in that layer is reduced, thus contributing to improvement in quality of the photosensitive planographic printing plate. In this case, when the coating layer is an uppermost layer or intermediate layer, the obtained effect is significant.

In the multi-layer photosensitive planographic printing plate, when a photosensitive sublayer having an average thickness of 0.2 to 1.0 g/m² is applied onto a grained support having an undercoat layer of 0.1 g/m² or less undetectable as coating thickness, and then subjected to usual drying with hot air, unevenness or irregularities with reduced undulation resembling a pattern of grained irregularities are generated on the surface of the photosensitive sublayer. A top layer is then generally formed such that, given the difference h in height between the top and the bottom of the irregularities thus generated at the surface of a sublayer, and the average thickness t of the top layer applied thereon, h and t satisfy the relationship: $t/h \leq 0.7$.

In a second aspect of the invention, there is provided a method of producing a photosensitive planographic printing plate by continuously running a web having a roughened surface and simultaneously applying a coating solution onto the surface and then drying the applied coating solution film to form a coating layer, which method comprising blowing dry air roughly parallel to the coating solution film in a drying chamber after application of the coating solution.

The dry air is blown at a speed such that the coating solution film is prevented from being dried with the thickness distribution thereof being made uneven by the dry air.

According to this aspect, the direction of dry air blown is roughly parallel to the coating solution film in the method of producing a photosensitive planographic printing plate, as described above. The thickness distribution of the coating solution film can thereby be prevented from becoming uneven by the force of dry air. Further, when the coating solution is applied to form multiple layers on a continuously running web, the drying facilities can be made compact.

To achieve uniform thickness of the coating layer (particularly the top layer), the coating solution is preferably dried as rapidly as possible while the leveling of a coating solution film comprising the coating solution applied onto a web is suppressed. This can be effectively accomplished by constantly blowing air (for example fresh air) wherein the partial pressure ratio of solvent contained in the coating solution film is low, onto the coating solution film, so as not to affect the surface of the coating solution film, thus promoting evaporation of the solvent by renewal of the surface.

In a third aspect of the invention, the method of producing a photosensitive planographic printing plate according to the second aspect further comprises alternately arranging a plurality of feed openings for feeding the dry air and a plurality of exhaust openings for exhausting the dry air in the dry chamber.

The surface of the coating solution film is constantly supplied with fresh air wherein the partial pressure ratio of solvent contained in the coating solution film is low, and thus the speed of drying the coating solution film can be significantly increased.

In the process of continuously producing the photosensitive planographic printing plate, generally, the size of an aluminum substrate (web) is also continuously changed. In order to suppress a change in dry state accompanying a change in thickness and width, it is preferable that the temperature of the web and the temperature of the coating solution at the time of coating are maintained as high as possible as long as these temperatures do not cause any trouble in production, and that the drying process is conducted immediately after coating. As a result, the effects of differences in web size and in drying speed in the width direction can be eliminated as much as possible.

In a fourth aspect of the invention, the method of producing a photosensitive planographic printing plate according to the second aspect further comprises blowing the dry air at a temperature of 50° C. or more within 2 seconds after applying the coating solution.

This process is added to the method because the temperature of dry air is preferably 50° C. or more in terms of promoting evaporation of the solvent contained in the coating solution, and it is preferable that the coating solution film is exposed to dry air within 2 seconds after applying the coating solution in order to dry the coating solution film rapidly.

According to the present aspect, a difference in quality can be significantly reduced even if the web size is continuously changed.

In a fifth aspect of the invention, the method of producing a photosensitive planographic printing plate according to the second aspect further comprises regulating the temperature of the web by bringing a heat roll into contact with the web before carrying the web to the drying chamber. The temperature of the web can thereby be prevented from dropping due to the latent heat of the solvent to be evaporated.

In this case, the temperature of the heat roll is regulated such that there occurs no extreme fluidization within the coating solution film. From the viewpoint of rapid drying, the heat roll is abutted onto the aluminum substrate (web) preferably within 2 seconds after applying the coating solution.

The temperature of the aluminum substrate is desirably not higher than the boiling point of a solvent component contained in an amount of not less than 10% by weight in the coating solution. When the temperature of the aluminum substrate is higher than the boiling point, a satisfactory coating layer may not be obtained due to boiling of the solvent. From a practical viewpoint, it is preferable that a solvent having a boiling point of 100° C. or less is added in an amount of 50% or more as the solvent component in the coating solution.

Since the coating solution is applied to the photosensitive layer-side surface of the web, the roller is brought into contact with the reverse side (back side) of the web. In a carrying position where the roller is not arranged, the web may be heated with hot air or radiation.

In a sixth aspect of the invention, the method of producing a photosensitive planographic printing plate according to the fifth aspect further comprises regulating the temperature of the web after finishing drying of one coating solution film until start of application of a next coating solution, at a temperature within ±10° C. relative to the temperature after finishing drying.

The web heated in the previous process can thereby be coated with maintaining a high temperature at which coating is not disturbed, and thus the quantity of heat supplied can be effectively utilized in coating, to achieve a reduction in running cost. In this case too, the temperature of the aluminum substrate is desirably not higher than the boiling point of the solvent component contained in an amount of not less than 10% by weight in the coating solution.

By heating in advance the coating solution to reduce the difference in temperature between the coating solution and the web, a significant effect can be achieved. For example, the coating solution is heated to a temperature within ±10° C. relative to the temperature of the web. In particular, when a stable coating layer is to be formed on a web of continuously changing size, the temperature of the web which is being transferred to a coating zone where it is coated with the coating solution is regulated preferably at such predetermined temperature as described above regardless of the size of the web. In this case, it is more preferable that the coating solution is dried immediately after application.

The solvent used in the coating solution is preferably a low-boiling solvent. The temperature of the web or the coating solution is regulated often in a range of 40 to 90° C.

In a seventh aspect of the invention, the method of producing a photosensitive planographic printing plate according to the second aspect further comprises carrying the coating solution film such that the coating solution film is inclined toward a horizontal plane than a vertical plane, with the coating solution film facing downward, until the coating solution film is dried.

The influence of gravity on leveling is greater when the coating solution film is positioned as the upper side of the web. Therefore, according to the present aspect, the influence of gravity on leveling of the coating solution film can be minimized.

In the present aspect, it is also important that the leveling of the coating solution film is lowered by reducing the surface tension of the coating solution film itself. Specifically, the surface tension of the coating solution is reduced preferably to not higher than 35 dyne/cm or lower, and in order to satisfy this condition, a surfactant may be added to the coating solution. From a practical viewpoint, it is also preferable that the thickness of the coating solution film just after application is in a range of 5 to 25 cc/m$^2$.

The present invention is most suitable for producing a CTP printing plate, and the effect of the present invention is most significant when the invention is applied, not to the production of the lowermost layer, but to a second or upper layer of the CTP printing plate.

By virtue of the aspects described above, a change in the coating thickness distribution in the printing plate can be suppressed according to the invention. Accordingly, a highly sensitive photosensitive planographic printing plate having uniform performance in the printing plate can be produced.

DETAILED DESCRIPTION OF THE INVENTION

Figure 1:
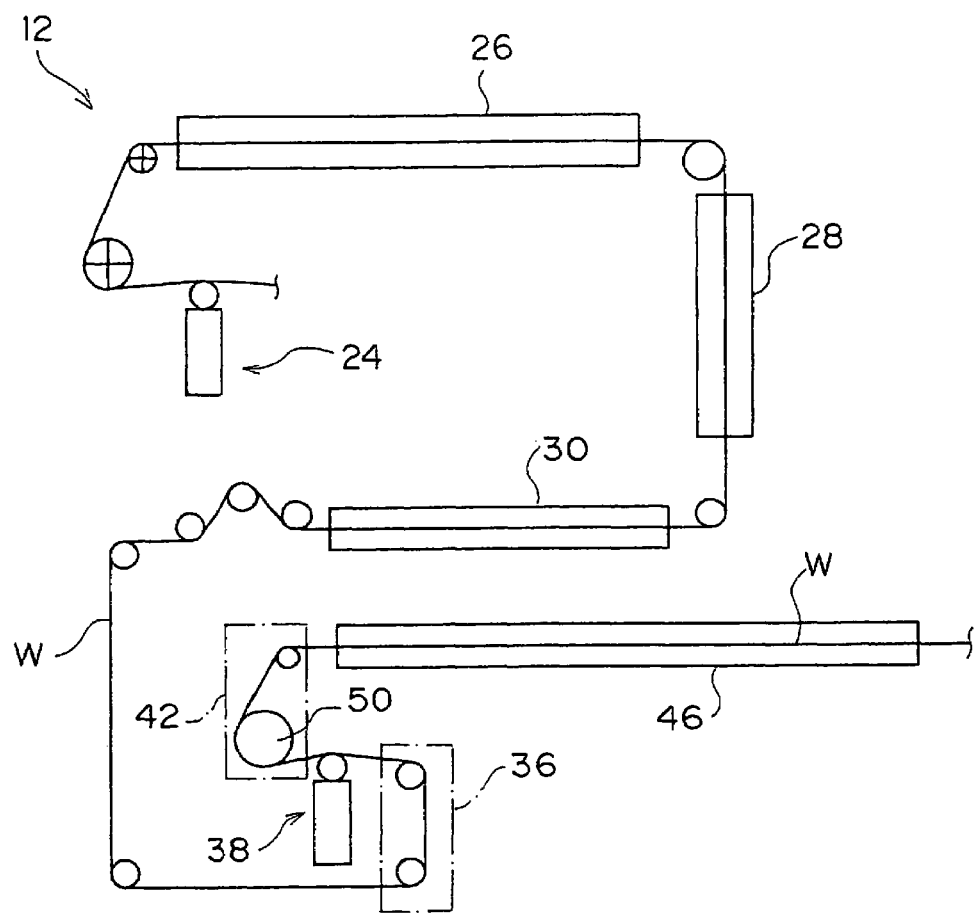
FIG. 1 is schematic side view showing a production line for producing a photosensitive planographic printing plate in one embodiment of the present invention.
Figure 3:
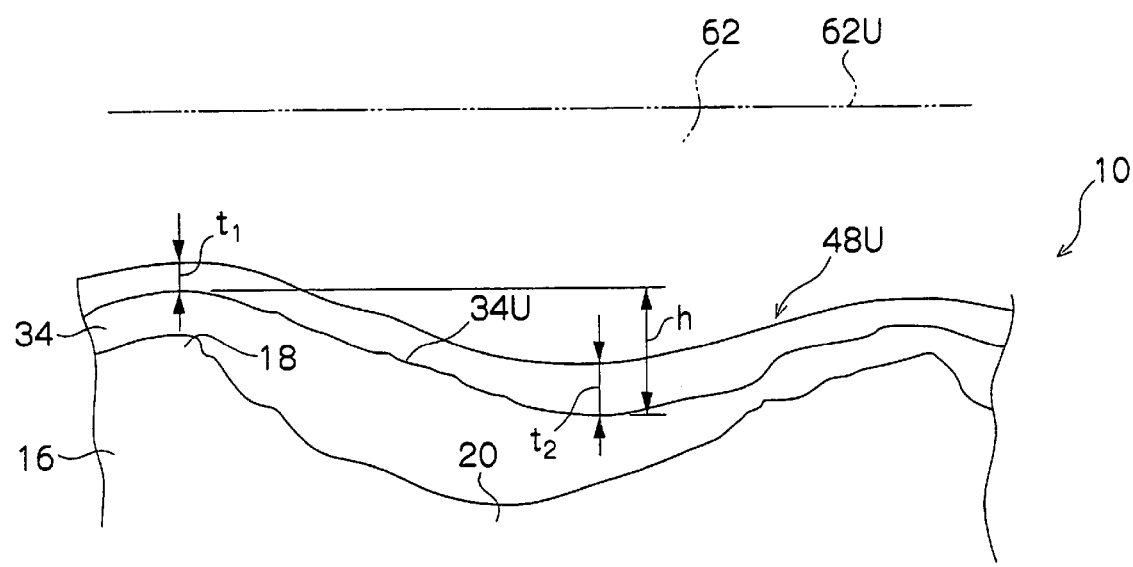
FIG. 3 is an enlarged sectional view of a side of a photosensitive planographic printing plate produced in one embodiment of the invention.
Figure 4:
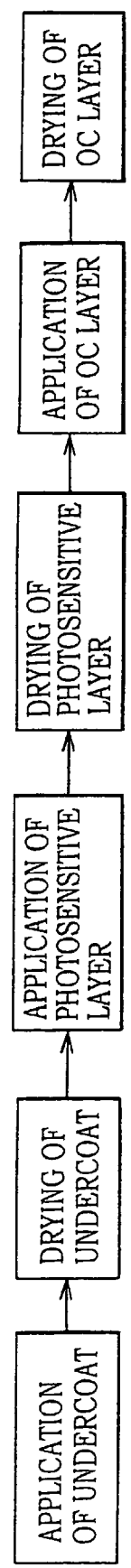
FIG. 4 is a flow chart showing a production process in one embodiment of the invention.
Figure 5:
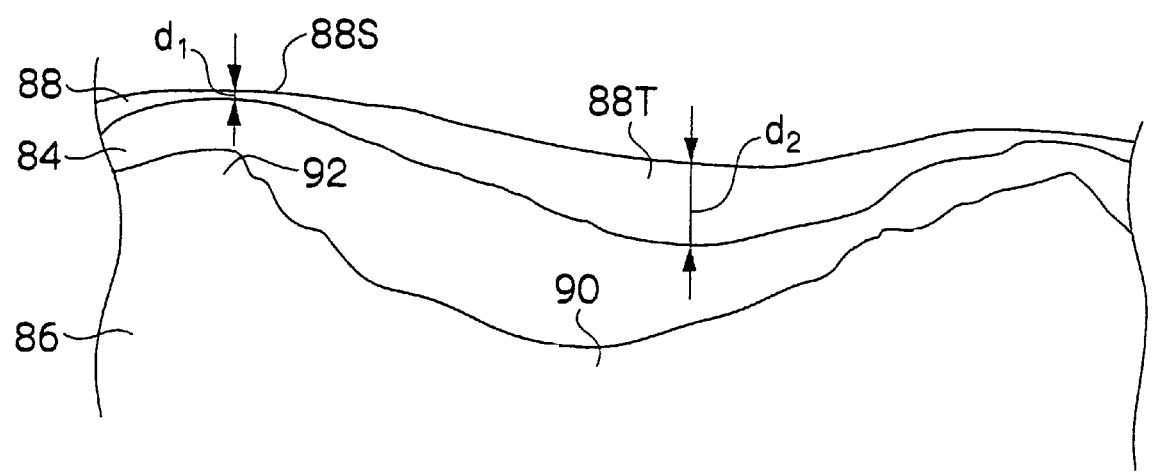
FIG. 5 is an enlarged sectional view showing a problem of a conventional photosensitive planographic printing plate.

Hereinafter, the present invention will be described by reference to embodiments thereof. In one embodiment of the invention, as shown in FIG. 1, a multi-layer coating layer is formed in production line 12 for producing a photosensitive planographic printing plate, and in the production line 12, a production process as shown in FIG. 4 is carried out, and as shown in FIG. 3, a planographic printing plate 10 in which uneven distribution of film thickness (layer thickness) between convex portion 18 and concave portion 20 in aluminum substrate 16 has been reduced is produced.

In production 12, a first coating part 24 for applying a coating solution onto an intended surface of web (continuous aluminum support) W, a first drying zone 26 to which the web W transferred from the first coating part 24 is transferred, and cooling zones 28, 30 for cooling the web transferred from the first drying zone 26 are arranged in this order. An undercoat application part (not shown) for applying an undercoat coating solution onto an intended surface of the web W and a drying part (not shown) for drying a coating solution film applied in the undercoat application part are also arranged in the production line 12. Accordingly, the web W delivered from the cooling zone 30 has an undercoat layer (not shown) and a photosensitive layer (sublayer) 34 formed thereon.

In production line 12, a high-temperature handling part 36 for handling the web W transferred from the cooling zone 30, a second coating part 38 for applying a coating solution onto the web W delivered from the high-temperature handling part 36, a rapid drying part 42 for rapidly drying the web W delivered from the second coating part 38, and a second drying zone 46 for further drying the web W delivered from the rapid drying part 42 are arranged in this order. In the web W transferred from the second drying zone 46, an OC layer 48 (top layer) is formed as a top layer on a photosensitive layer 34.

In the rapid drying part 42, a heat roll 50 abutted onto a side of web W on which the coating solution is not applied, and a parallel stream drying part 54 where the coating solution film applied in the second coating part 38 is dried with dry air blown parallel to the web W after contacting with the heat roll 50 (see FIG. 2) are arranged. The positions of the heat roll 50 and parallel stream drying part 54 are determined by taking into account the running speed of Web W, such that after the web W is coated with the coating solution in the second coating part 38, the web W can be transferred within 2 seconds to the parallel stream drying part 54.

Figure 2:
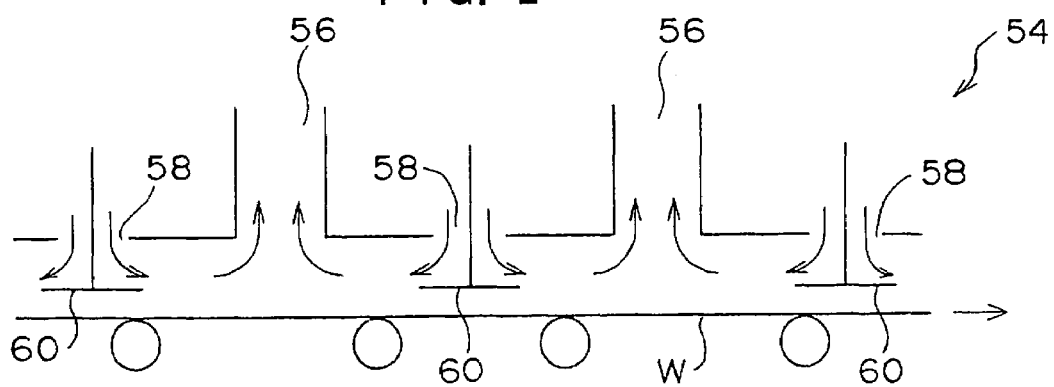
FIG. 2 is a schematic diagram showing a principle of drying in a parallel stream drying part arranged in a production line used in one embodiment of the invention.

In the parallel stream drying part 54, as shown in FIG. 2, air exhaust openings 56 and air feed openings 58 arranged at predetermined intervals to exhaust air in multiple stages are provided, and each air feed opening 58 is arranged in the middle of its adjacent exhaust openings. Accordingly, the surface of the coating solution film 62 formed by coating (see FIG. 3) is supplied with fresh air (outside air) wherein the partial pressure ratio of the solvent component contained in the coating solution film 62 is always low. In the air feed opening 58, a stream-regulating plate 60 for regulating the supplied air (outside air) in a direction parallel to the web W is arranged. Accordingly, the thickness of the coating solution film 62 is prevented from changing due to the drying air stream when an OC layer 48 is formed.

In the second coating part 38, the coating solution is heated at a temperature which is as high as the web temperature so that a coating solution is applied at a high speed at high temperature. As the solvent in the coating solution applied in the second coating part 38, a solvent to be easily evaporated is used.

As shown in the dotted line in FIG. 3, the upper surface 62 U of the coating solution film 62 formed on the photosensitive layer 34 as a sublayer is virtually a horizontal plane right after application in the between the convex 18 and concave 20 in the aluminum substrate 16 is 3 μm, the thickness t1 of the coating solution film 62 is 5 μm in the convex 18, and the thickness t2 is 8 μm in the concave 20, and the average thickness is 6 μm.

When the web W is dried in this state in the rapid drying part 42, the solvent is evaporated from the surface of the coating solution film 62, and the upper surface 48U of the OC layer 48 as the top layer forms into a shape almost contour along the upper surface 34U of the photosensitive layer 34 as the sublayer. Accordingly, the uneven thickness distribution of the top layer (OC layer) 48 between the convex 18 and concave 20 can be reduced.

In this example described above, fresh air (air wherein the partial pressure ratio of the solvent component is low) runs parallel to the web W in the parallel stream drying part 54, and thus the coating solution film 62 is prevented from changing its thickness with dry air, and the drying speed in the parallel stream drying part 54 is high. The coating solution film 62 is formed in the second coating part 38 and then immediately dried in the rapid drying part 42 where the coating solution film 62 can be dried to form the OC layer (top layer) 48 before the coating solution film 62 is leveled. Accordingly, the thickness distribution of the OC layer 48 between the convex 18 and concave 20 in the aluminum substrate 16 can be reduced, and thus a photosensitive planographic plating plate 10 having uniform thickness can be produced.

EXAMPLES

[Substrate Preparation 1]

An aluminum plate having a thickness of 0.24 mm (aluminum alloy containing 0.06% by mass of Si, 0.30% by mass of Fe, 0.014% by mass of Cu. 0.001% by mass of Mn, 0.001% by mass of Mg, 0.001% by mass of Zn and 0.03% by mass of Ti, the remainder being Al and inevitable impurities) was subjected successively to the following surface treatment.

The plate was subjected continuously to electrochemical surface roughening treatment with an alternating current of 60 Hz. The electrolyte used was 10 g/L of aqueous nitric acid solution (containing 5 g/L of aluminum ion and 0.007% by mass of ammonium ion) at a temperature of 80° C.

After the electrochemical surface roughening treatment, the aluminum plate was washed with water and then subjected to etching treatment at 32° C. by spraying with an alkali solution containing sodium hydroxide at a concentration of 26% by mass and aluminum ion at a concentration of 6.5% by mass, whereby the aluminum plate was dissolved in an amount of 0.20 g/m$^2$.

After the etching treatment, the aluminum plate was washed by spraying with water, then subjected to desmutting treatment by spraying with an acidic solution containing sulfuric acid at a concentration of 25% by mass (the solution also containing 0.5% by mass of aluminum ion) at a temperature of 65° C., and washed by spraying with water.

The aluminum plate subjected to desmutting treatment and washing with water was subjected to anodizing treatment with an anodizing device by a two-stage current feeding electric field treatment method. Sulfuric acid was fed to an electric field zone. After the anodizing treatment, the aluminum plate was washed by spraying with water. The amount of the final anodized coating was 2.7 g/m$^2$.

The aluminum support obtained by anodizing treatment was subjected to alkali metal silicate treatment (silicate treatment) by dipping it in a treatment bath of 1% by mass of aqueous sodium silicate No. 3 at a temperature of 30° C. for 10 seconds. Thereafter, the aluminum support was washed by spraying with water.

After the alkali metal silicate treatment, the resulting aluminum support was coated with an undercoat solution having the following composition and then dried at 80° C. for 15 seconds, to form a coating thereon. The amount of the coating after drying was 15 mg/m$^2$.

| [Undercoat solution composition] | |
| --- | --- |
| The following compound (formula 1) | 0.3 g |
| Methanol | 100 g |
| Water | 1 g |

-continued

[Undercoat solution composition]

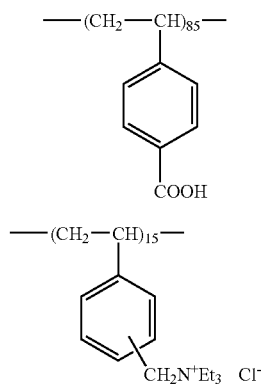

Weight average molecular weight 28,000

1. Example 1

[Production of a Planographic Printing Plate Precursor]

The substrate obtained in the above procedure was coated with coating solutions to form coating layers in the production line 12 shown in FIG. 1. In the production line 12, a bar coater was used in both the first coating part 24 and the second coating part 38.

First, a sublayer coating solution 1 was applied in the first coating part 24 such that the coating amount after drying was 0.85 g/m², and then the coating solution was dried at 178° C. for 35 seconds in the first drying zone 26, and immediately cooled with cool air at 17 to 20° C. in cooling zones 28 and 30 until the temperature of the support fell to 50° C.

Next, while the temperature of the support was kept at 50° C. in a high-temperature handling part 36, an upper thermal sensitive coating solution 1 kept at 50° C. was applied in a second coating part 38 such that the average coating amount after drying was 0.22 g/m², and immediately thereafter, the back (the side other than the side where the sublayer coating solution 1 and the upper thermal sensitive coating solution 1 were applied) of the support was heated with a heat roll 50 having a surface temperature set at 70° C., followed by drying for 2 seconds in a parallel stream drying part 54 (temperature of hot air, 120° C.) until the upper thermal sensitive layer lost fluidity. The support was further dried at 149° C. for 20 seconds and cooled with cool air at 20 to 26° C. to form a planographic printing plate precursor 1.

In the planographic printing plate precursor 1, the unevenness of the upper thermal sensitive layer was improved, and the thickness of the coating in the thinnest part of the upper thermal sensitive layer was 0.12 μm, and the thickness of the coating in the thickest part of the sensitive layer was 0.3 μm.

The compositions of the sublayer coating solution 1 and the upper thermal layer coating solution 1 are shown below.

(Sublayer coating solution 1)

| | |
|---|---|
| N-(4-aminosulfonylphenyl)methacrylamide/ acrylonitrile/methyl methacrylate copolymer (copolymerization molar ratio = 36/34/30, weight average molecular weight 50,000, acid value 2.65) | 2.133 g |
| Cyanine dye A (shown in formula 2 below) | 0.134 g |
| 4,4'-Bishydroxyphenyl sulfone | 0.126 g |
| Tertrahydrophthalic anhydride | 0.190 g |
| p-Toluenesulfonic acid | 0.008 g |
| 3-Methoxy-4-diazodiphenylamine hexafluorophosphate | 0.032 g |
| Ethyl Violet whose counterion was replaced by 6-hydroxynaphthalenesulfonic acid | 0.0781 g |
| Polymer 1 (shown in formula 3 below) | 0.035 g |
| Methyl ethyl ketone | 25.41 g |
| 1-Methoxy-2-propanol | 12.97 g |
| γ-Butyrolactone | 13.18 g |

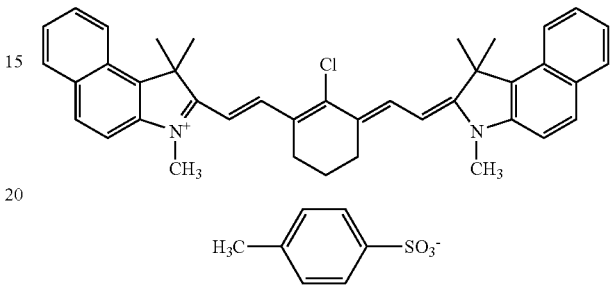

Cyanine dye A

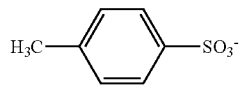

Polymer 1
(Upper thermal sensitive coating solution 1)

| | |
|---|---|
| m, p-Cresol novolak (m/p ratio 6/4, weight average molecular weight 4500, containing 0.8% by mass of unreacted cresol) | 0.3479 g |
| Cyanine dye A (shown in formula 2 above) | 0.0192 g |
| Ethyl methacrylate/isobutyl methacrylate/ acrylic acid copolymer (copolymerization ratio = 37/37/26 wt %) 30% MEK solution | 0.1403 g |
| Polymer 1 (shown in formula 3 above) | 0.015 g |
| Polymer 2 (shown in formula 4 below) | 0.00328 g |
| Methyl ethyl ketone | 10.39 g |
| 1-Methoxy-2-propanol | 20.78 g |

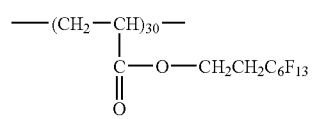

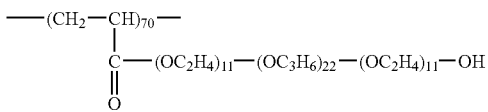

Polymer 2

[Evaluation of Sensitivity]

The planographic printing plate precursor produced according to the above procedure was exposed with a beam intensity of 2 to 10 W at a drum revolution speed of 150 rpm with Trendsetter (trade name, manufactured by Creo) to draw a solid image thereon. Then, the planographic printing plate was developed for 12 seconds with PS Processor LP940H (manufactured by Fuji Photo Film Co., Ltd.) charged with a developer DT-2 (trade name, diluted at 1:8, manufactured by Fuji Photo Film Co., Ltd.) and Finisher FG-1 (trade name, diluted at 1:1, manufactured by Fuji Photo Film Co., Ltd.), with the temperature of the liquids was kept at 30° C. The electrical conductivity of the developer was 43 mS/cm.

After development, the plate was observed with a 25-power magnifying glass, and evaluated on whether a residual coating at a level not substantially causing staining had occurred or not. From the intensity of exposure beam on a portion where no residual coating had been observed, the actual exposure energy was calculated to determine the sensitivity. The evaluation results are shown in Table 1. A planographic printing plate with less exposure energy has higher sensitivity.

[Evaluation of Development Latitude]

The planographic printing plate precursor produced according to the above procedure was exposed with a beam intensity of 9 W at a drum revolution speed of 150 rpm with the above Trendsetter to draw a test pattern thereon, and then developed. The planographic printing plate precursor was developed for 12 seconds with PS Processor LP940H charged with a developer DT-2R (trade name, diluted at 1:5, a carbon dioxide gas was blown to regulate the electrical conductivity at 37 mS/cm, manufactured by Fuji Photo Film Co., Ltd.) and Finisher FG-1 (trade name, diluted at 1:1, manufactured by Fuji Photo Film Co., Ltd.), with the temperature of the liquids was kept at 30° C. Then, the planographic printing plate precursor having a test pattern drawn thereon was developed with a developer prepared by adding a suitable amount of DT-2R (diluted at 1:5) to the above developer to regulate the electrical conductivity at 39 mS/cm. By using developers each prepared by increasing the amount of DT-2R (diluted at 1:5) added to the above developer so as to increase electrical conductivity thereof serially by 2 mS/cm, the above-described developing operation was repeated until the wear of the coating by development of the image became considerably noticeable.

The surface of the planographic printing plate precursor developed at each electrical conductivity was visually evaluated to confirm whether staining or coloring attributable to the residual thermal sensitive film caused by insufficient development had occurred or not. The electrical conductivity of the developer with which excellent development had been feasible was determined, and then the critical electrical conductivity at which the wear of the coating by development had been somehow maintained to such a degree as not to substantially influence printing durability was determined. The range of from the electrical conductivity at which excellent development had been feasible to the critical electrical conductivity at which the wear of the coating by development had been somehow maintained to such a degree as not to substantially influence printing durability was regarded as the development latitude. The results are shown in Table 1.

TABLE 1

| | | Minimum thickness of the top layer (μm) | Maximum thickness of the top layer (μm) | Sensitivity (mJ/cm$^2$) | Development latitude (mS/cm) |
|---|---|---|---|---|---|
| Example 1 | Planographic printing plate precursor 1 | 0.15 | 0.30 | 55 | 39 to 49 |
| Comparative Example 1 | Planographic printing plate precursor 2 | 0.09 | 0.60 | 63 | 41 to 49 |
| Comparative Example 2 | Planographic printing plate precursor 3 | 0.06 | 1.00 | 65 | 41 to 49 |

2. Comparative Example 1

The production line 12 shown in FIG. 1 was used, and first the sublayer coating solution 1 was applied in the first coating part 24 such that the coating amount after drying was 0.85 g/m$^2$, then dried at 178° C. for 35 seconds in the first drying zone 26, and immediately cooled with cool air at 17 to 20° C. in cooling zones 28 and 30 until the temperature of the support fell to 35° C.

Next, the upper thermal sensitive coating solution 1 at a temperature of 25° C. was applied in the second coating part 38 such that the average coating amount after drying was 0.22 g/m$^2$, and immediately the back of the support was heated for 2 seconds in the parallel stream drying part 54 (temperature of hot air, 120° C.) and further dried at 149° C. for 20 seconds and cooled with cool air at 20 to 26° C. to form a planographic printing plate precursor 2.

In the planographic printing plate precursor 2, the unevenness of the thickness of the upper thermal sensitive layer was slightly improved, but the thickness of the coating in the thinnest part of the upper thermal sensitive layer was 0.09 μm, and the thickness of the coating in the thickest part of the sensitive layer was 0.6 μm.

The planographic printing plate precursor 2 was evaluated for its sensitivity and development latitude by the same procedure as in Example 1. The results are shown in Table 1.

3. Comparative Example 2

The production line 12 as shown in FIG. 1 was used, and first the sublayer coating solution 1 was applied in the first coating part 24 such that the coating amount after drying was 0.85 g/m$^2$, then dried at 178° C. for 35 seconds in the first drying zone 26, and immediately cooled with cool air at 17 to 20° C. in cooling zones 28 and 30 until the temperature of the support fell to 35° C.

Next, the upper thermal sensitive coating solution 1 at a temperature of 25° C. was applied in the second coating part 38 such that the average coating amount after drying was 0.22 g/m², and immediately the support was dried at 149° C. for 20 seconds and cooled with cool air at 20 to 26° C. to form a planographic printing plate precursor 3.

In the planographic printing plate precursor 3, the thickness of the upper thermal sensitive layer was uneven, and the thickness of the coating in the thinnest part of the upper thermal sensitive layer was 0.06 μm, and the thickness of the coating in the thickest part of the sensitive layer was 1.0 μm.

The planographic printing plate precursor 3 was evaluated for its sensitivity and development latitude by the same procedure as in Example 1. The results are shown in Table 1.

As is evident from Table 1, by making the minimum thickness of the upper thermal sensitive layer greater than 50% (0.11 μm) of the average thickness of the thermal sensitive layer and the maximum thickness of the thermal sensitive layer less than 150% (0.33 μm) of the average thickness of the thermal sensitive layer, occurrence of dotted residual film can be suppressed. In conclusion, the planographic printing plate in Example 1 was found to have excellent sensitivity and planographic printing plates in Comparative Examples 1 and 2.

Additional Examples

As the multi-layer photosensitive planographic printing plate described above, three types of two-layer thermal positive photosensitive planographic printing plates were produced by changing the distribution of film thickness of the upper (top) layer thereof from one another. Occurrence of dotted residual film and evenness of sensitivity were evaluated for each of these three types of photosensitive planographic printing plates. The distribution of film thickness of the upper layer (indicated by the minimum film thickness and the maximum film thickness of the upper layer) and the evaluation results of "Occurrence of dotted residual film" and "evenness of sensitivity" are shown in Table 2 below.

printing plate, occurrence of dotted residual film was observed and evenness of sensitivity was poor.

(2) In the case of the photosensitive planographic printing plate of type (2), the back (the non-coating side) of the web was heated with the heat roll 50 (refer to FIG. 1) in the parallel stream drying part 54. As a result, the ratio of the minimum film thickness to the maximum film thickness of the upper layer was decreased, wherein the minimum film thickness was 0.15 μm and the maximum film thickness was 0.8 μm. In this printing plate, evenness of sensitivity was improved, although some dotted residual film was observed as in (1).

(3) The production of the photosensitive planographic printing plate of type (3) differed from that of the printing plate of type (2), in that the web W was handled at the high-temperature handling part 36 (refer to FIG. 1) and the coating solution applied at the second coating part 38 (refer to FIG. 1) had been preheated to a temperature as high as the temperature of the web. As a result, the ratio of the minimum film thickness to the maximum film thickness of the upper layer was further decreased than in the type (2), wherein the minimum film thickness was 0.20 μm and the maximum film thickness was 0.6 μm. In this printing plate, no dotted residual film was observed and evenness of sensitivity was excellent.

From the aforementioned results of the present example, it has been confirmed that occurrence of dotted residual film and variation in sensitivity can be significantly suppressed by reducing variation in the film thickness distribution of the upper layer.

The invention has been described above by reference to the embodiments thereof. However, these embodiments are described for mere illustrative purposes, and the invention can be modified within the scope of the invention. Needless to say, the scope of the invention is not limited to the above embodiments.

What is claimed is:

1. A photosensitive planographic printing plate produced by continuously running a web having a roughened surface and simultaneously forming a coating layer on the surface, the coating layer comprising:
   a thinnest layer portion; and
   a thickest layer portion,
   wherein the thinnest layer portion has a thickness of 50% or more of the average thickness of the coating layer, and the thickest layer portion has a thickness of 150% or less of the average thickness of the coating layer,

TABLE 2

| Type of photosensitive planographic printing plate | Production Method of photosensitive planographic printing plate | Minimum thickness of the top layer (μm) | Maximum thickness of the top layer (μm) | Occurrence of dotted residual film | Sensitivity |
|---|---|---|---|---|---|
| (1) | Conventional method | 0.10 | 1.0 | None | Poor |
| (2) | Heating back of web with supplying parallel air stream | 0.15 | 0.8 | None | Good |
| (3) | (2) plus coating at a high temperature | 0.20 | 0.6 | Observed | Excellent |

(1) In the case of the photosensitive planographic printing plate produced according to the conventional production method, the minimum film thickness of the upper layer was 0.10 μm and the maximum film thickness was 1.0 μm. In this wherein the difference h in height between a concave portion and a convex portion of the coating surface of the web, and the average thickness t of the coating layer, satisfy the relationship: $t/h \leq 0.7$.

2. A photosensitive planographic printing plate according to claim 1, which is a multi-layer photosensitive planographic printing plate wherein the coating layer is an uppermost layer or an intermediate layer.

3. A photosensitive planographic printing plate according to claim 1, wherein the average thickness of the coating layer is in a range of 0.2 μm to 1.0 μm.

4. A photosensitive planographic printing plate produced by continuously running a web having a roughened surface and simultaneously forming one or more coating layers sequentially on the surface, each of the coating layers comprising:
a thinnest layer portion;
a thickest layer portion; and
an average layer thickness,
wherein, in at least one of an uppermost layer and an intermediate layer just under the uppermost layer of the coating layers, the thinnest layer portion has a thickness of 50% or more of the average layer thickness, and the thickest layer portion has a thickness of 150% or less of the average layer thickness, and the difference h in height between a concave portion and a convex portion of the coating surface of the web and the average thickness t of at least one of the uppermost layer and the intermediate layer, satisfy the relationship: $t/h \leq 0.7$.

5. A photosensitive planographic printing plate according to claim 4, wherein the average thickness of the coating layer is in a range of 0.2 μm to 1.0 μm.

6. A photosensitive planographic printing plate according to claim 4, wherein the coating layer is formed by blowing dry air onto a coating solution film formed by application of a coating solution, such that the dry air is blown roughly parallel to the coating solution film.

* * * * *